(12) United States Patent
Kawamura et al.

(10) Patent No.: US 7,829,461 B2
(45) Date of Patent: Nov. 9, 2010

(54) METHOD FOR FABRICATING SEMICONDUCTOR DEVICE

(75) Inventors: Kazuo Kawamura, Kawasaki (JP); Shinichi Akiyama, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 436 days.

(21) Appl. No.: 11/898,409

(22) Filed: Sep. 12, 2007

(65) Prior Publication Data
US 2008/0124922 A1    May 29, 2008

(30) Foreign Application Priority Data
Nov. 29, 2006 (JP) .............................. 2006-321742

(51) Int. Cl.
*H01L 21/44* (2006.01)
(52) U.S. Cl. ...................................... 438/664; 438/682
(58) Field of Classification Search .................... None
See application file for complete search history.

(56) References Cited

U.S. PATENT DOCUMENTS

| | | | | |
|---|---|---|---|---|
| 7,279,422 | B2 * | 10/2007 | Choi .......................... | 438/682 |
| 2002/0146904 | A1 * | 10/2002 | Buynoski et al. ............. | 438/682 |
| 2005/0202664 | A1 * | 9/2005 | Jawarani ..................... | 438/592 |
| 2006/0267117 | A1 * | 11/2006 | Jaiswal ....................... | 257/412 |
| 2007/0166974 | A1 * | 7/2007 | Uchino et al. ................ | 438/592 |
| 2007/0166975 | A1 * | 7/2007 | Uchino et al. ................ | 438/592 |
| 2007/0167009 | A1 * | 7/2007 | Chen et al. .................. | 438/682 |
| 2007/0173047 | A1 * | 7/2007 | Lu et al. ..................... | 438/592 |
| 2007/0202695 | A1 * | 8/2007 | Kawamura et al. .......... | 438/664 |
| 2007/0254477 | A1 * | 11/2007 | Muraoka et al. ............. | 438/679 |
| 2007/0254479 | A1 * | 11/2007 | Fang et al. .................. | 438/682 |
| 2007/0257303 | A1 * | 11/2007 | Liu et al. ..................... | 257/315 |
| 2008/0242035 | A1 * | 10/2008 | Futase et al. ................ | 438/296 |
| 2009/0008727 | A1 * | 1/2009 | Yamauchi et al. ........... | 257/412 |
| 2009/0011566 | A1 * | 1/2009 | Okada et al. ................ | 438/308 |
| 2009/0212021 | A1 * | 8/2009 | Bernhard et al. ............ | 216/109 |

FOREIGN PATENT DOCUMENTS

| | | |
|---|---|---|
| JP | 58-213465 A | 12/1983 |
| JP | 2004-128501 A | 4/2004 |

OTHER PUBLICATIONS

Derwent Abstracted-Pub-No. KR 2006007108. Kang. 1 drawing. Jan. 2006.*

(Continued)

*Primary Examiner*—David E Graybill
(74) *Attorney, Agent, or Firm*—Westerman, Hattori, Daniels & Adrian, LLP

(57) ABSTRACT

A semiconductor device fabrication method by which the thermal stability of nickel silicide can be improved. Nickel (or a nickel alloy) is formed over a semiconductor substrate on which a gate region, a source region, and a drain region are formed. Dinickel silicide is formed by performing a first annealing step, followed by a selective etching step. By performing a plasma treatment step, plasma which contains hydrogen ions is generated and the hydrogen ions are implanted in the dinickel silicide or the gate region, the source region, and the drain region under the dinickel silicide. The dinickel silicide is phase-transformed into nickel silicide by performing a second annealing step.

13 Claims, 15 Drawing Sheets

FILM FORMATION STEP

FIRST ANNEALING STEP

OTHER PUBLICATIONS

"Nickel-silicidation process using hydrogen implantation." Choi. Electronics Letters. Mar. 2004 vol. 40 No. 6.*

M. Tinani et al.; "In situ real-time studies of nickel silicide phase formation"; J. Vac. Sci. Technol. B19(2), Mar./Apr. 2001, pp. 376-383.

D. Mangelinck et al.; "Effect of $Co_2$ Pt, and Au additions on the stability and epitaxy of $NiSi_2$ films on (111)Si", Journal of Applied Physics; vol. 84, No. 5; Sep. 1, 1998; pp. 2583-2590.

Wei Huang et al.; "Effect of a thin W interlayer on the thermal stability and electrical characteristics of NiSi film", J. Vac. Sci. Technol. B23(6), Nov./Dec. 2005, pp. 2304-2308.

Chao-Chun Wang et al.; "Formation of NiSi-Silicided p+n. Shallow Junctions Using Implant -Through-Silicide and Low Temperature Furnace Annealing", Journal of the Electrochemical Society, vol. 150, No. 9; Jul. 24, 2003; pp. G557-G562.

Chel-Jong Choi et al, ; "Effects of Hydrogen Implantation on the Structural and Electrical Properties of Nickel Silicide", Journal of the Electrochemical Society, vol. 149, No. 9; Jul. 16, 2002, pp. G517-G521.

D. Z. Chi et al.: "Addressing Materials and Process-Integration Issues of NiSi Silicide Process Using Impurity Engineering", Institute of Materials Research and Engineering; 2004 IEEE, Mar. 15, 2004, pp. 113-118.HI.

Jang-Gn Yun et al.: "Abnormal Oxidation of Nickel Silicideon N-Type Substrate and Effect of Preamorphization Implantation", Japanese Journal of Applied Physics; vol. 43, No. 10, Oct. 8, 2004, pp. 6998-6999.

Jorge A. Kittl et al.; "Applications of Ni-based silicides to 45nm CMOS and Beyond". Mat. Res. Soc. Symp. Proc. vol. 810; Apr. 12, 2004; pp. C2.1.1-C2.1.12.

Kwan-Woo Do et al; "Formation of Low-Resistivity Nickel Silicide with High Temperature Stability from Atomic-Layer-Deposited Nickel Thin Film", Japanese Journal of Applied Physics; vol. 45 No. 4B, Apr. 25, 2006; pp. 2975-2979.

* cited by examiner

FILM FORMATION STEP

FIRST ANNEALING STEP

PLASMA TREATMENT STEP + SECOND ANNEALING STEP

METHOD FOR FABRICATING SEMICONDUCTOR DEVICE

CROSS-REFERENCE TO RELATED APPLICATIONS

This application is based upon and claims the benefits of priority from the prior Japanese Patent Application No. 2006-321742, filed on Nov. 29, 2006, the entire contents of which are incorporated herein by reference.

BACKGROUND OF THE INVENTION (1) Field of the Invention

This invention relates to a method for fabricating a semiconductor device and, more particularly, to a method for fabricating a semiconductor device in which nickel silicide (NiSi) is used.

(2) Description of the Related Art

Conventionally, cobalt silicide has been used for forming a gate electrode, a source electrode, and a drain electrode of a metal oxide semiconductor field-effect transistor (MOSFET). With MOSFETs in which gate length is below 40 nm, however, variation in the resistance of thin gate lines of cobalt silicide sharply becomes great. On the other hand, even if gate length is below 40 nm, the resistance of thin gate lines of nickel silicide is stable. Accordingly, attention has been riveted on nickel silicide.

However, the thermal stability of nickel silicide is low, so nickel silicide easily agglomerates at a temperature of about 500° C. (see M. Tinani, et al., "In situ real-time studies of nickel silicide phase formation", J. Vac. Sci. Technol. B 19(2), 376 (2001)). In anh interconnection process performed after a salicide process for forming nickel silicide, the nickel silicide is exposed to a temperature of about 400° C. for a long period of time. As a result, the nickel silicide agglomerates. Therefore, high-resistance nickel disilicide ($NiSi_2$) or the like is formed. In addition, the nickel disilicide is in proximity to a pn junction and junction leakage occurs.

To suppress such agglomeration of nickel silicide, techniques for doping nickel with impurities, such as platinum (Pt), palladium (Pd), fluorine (F), nitrogen (N), tantalum (Ta), tungsten (W), or carbon (C), have conventionally been proposed (see D. Mangelinck, et al., "Effect of Co, Pt, and Au additions on the stability and epitaxy of $NiSi_2$ films on (111) Si", J. Appl. Phys., 84, 2583 (1988); D. Z. Chi, et al., "Addressing Materials and Process-Integration Issues of NiSi Silicide Process Using Impurity Engineering", The 4th International Workshop on Junction Technology, pp. 113 (2004); C.-C. Wang, et al., "Formation of NiSi-Silicided $p^+n$ Shallow Junctions Using Implant-Through-Silicide and Low-Temperature Furnace Annealing", J. Electrochem. Soc., 150, G557 (2003); J.-G. Yun, et al., "Abnormal Oxidation of Nickel Silicide on N-Type Substrate and Effect of Preamorphization Implantation", Jpn. J. Appl. Phys., 43, 10, 6998 (2004); J. A. Kittl, et al., "Applications of Ni-based suicides to 45 nm CMOS and Beyond", Mat. Res. Soc. Symp. Proc. 810, C2.1.1 (2004); W. Huang, et al., "Effect of a thin W interlayer on the thermal stability and electrical characteristics of NiSi film", J. Vac. Sci. Technol. B23, 2304 (2005); and K.-W. Do, et al., "Formation of Low-Resistivity Nickel Silicide with High Temperature Stability from Atomic-Layer-Deposited Nickel Thin Film", Jpn. J. App. Phys. 45 B 2975 (2006)).

Furthermore, it is reported that a thermal stability is improved by depositing a nickel film over a silicon substrate and implanting hydrogen ions in the nickel film with hydrogen plasma (see C.-J. Choi, et al., "Effects of Hydrogen Implantation on the Structural and Electrical Properties of Nickel Silicide", J. Electrochem. Soc., 149, G517 (2002)). According to this report, a nickel film with a thickness of 30 nm is deposited over a silicon substrate, hydrogen ions are implanted in the nickel film, and annealing is performed. By doing so, nickel silicide is formed. According to C.-J. Choi, et al., "Effects of Hydrogen Implantation on the Structural and Electrical Properties of Nickel Silicide", J. Electrochem. Soc., 149, G517 (2002), the principal factor in the improvement of the thermal stability of nickel silicide is that the grain size of nickel silicide becomes small by adopting the above method.

By the way, usually temperature at which silicide agglomerates rises in proportion to film thickness. That is to say, a thick silicide film is hard to agglomerate. The reason for this is that grain boundary energy lowers in proportion to film thickness. From the viewpoint of the process technology of fabricating transistors the size of which is 90 nm or less, however, junction depth is 100 nm or less. Accordingly, it is desirable that the thickness of a silicide film should be about 20 nm or less. If such a thin silicide film is formed, nickel silicide agglomerates even at a temperature lower than or equal to 500° C. As a result, the improvement of the thermal stability of nickel silicide has become more and more necessary.

Japanese Unexamined Patent Publication No. 58-213465 discloses the use of hydrogen plasma at the time of forming a Schottky barrier diode on polycrystalline silicon. If this technique is used, hydrogen combines with dangling bonds in polycrystalline silicon, the band structure of the polycrystalline silicon becomes close to that of single crystal silicon, and a Schottky barrier diode having good characteristics is obtained.

In addition, Japanese Unexamined Patent Publication No. 2004-128501 discloses performing ammonia ($NH_3$) plasma treatment for the purpose of improving adhesion between nickel silicide, which is an electrode, and silicon nitride (SiN), which is an etching stopper.

However, the size of transistors has become minuter in recent years and the thermal stability of nickel silicide cannot be improved sufficiently by conventional techniques.

SUMMARY OF THE INVENTION

The present invention was made under the background circumstances described above. An object of the present invention is to provide a semiconductor device fabrication method by which the thermal stability of nickel silicide can be improved.

In order to achieve the above object, a method for fabricating a semiconductor device is provided. This method comprises the step of forming nickel or a nickel alloy over a semiconductor substrate on which a gate region, a source region, and a drain region are formed, the first annealing step of forming dinickel silicide in the gate region, the source region, and the drain region by performing annealing treatment at a first temperature, the plasma treatment step of generating plasma which contains hydrogen ions and implanting the hydrogen ions in the dinickel silicide or the gate region, the source region, and the drain region under the dinickel silicide, and the second annealing step of phase-transforming the dinickel silicide into nickel silicide by performing annealing treatment at a second temperature.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments of the present invention will now be described in detail with reference to the drawings.

Figure 1A:
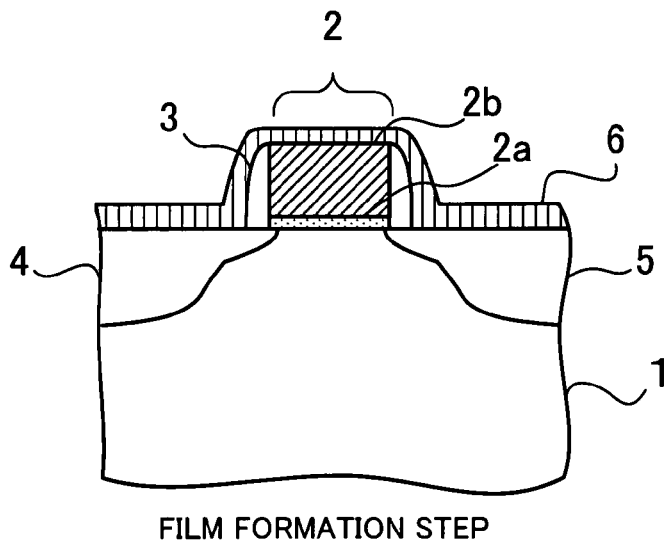
FIGS. 1A, 1B, and 1C are schematic sectional views showing a method for fabricating a semiconductor device, according to an embodiment of the present invention.
Figure 1B:
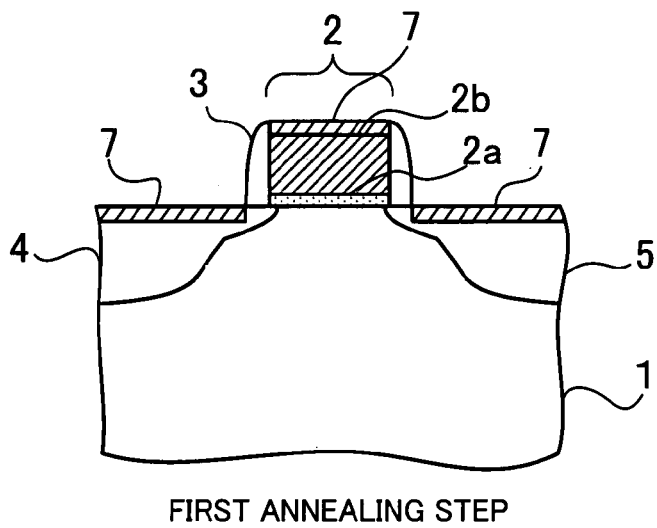
Figure 1C:
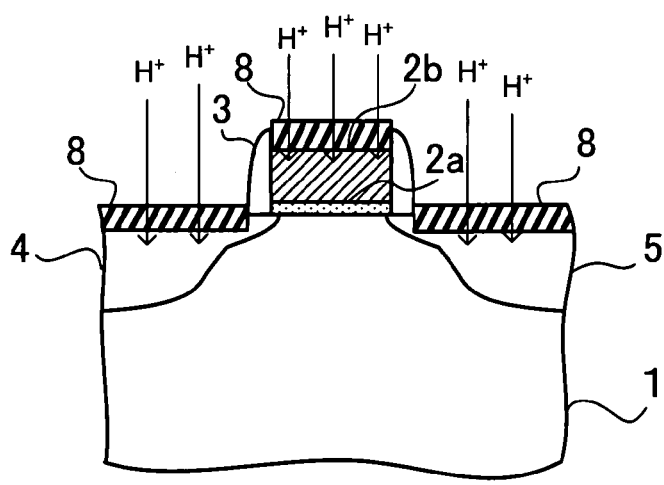

FIGS. 1A, 1B, and 1C are schematic sectional views showing a method for fabricating a semiconductor device, according to an embodiment of the present invention.

It is assumed that a gate region 2, a sidewall 3, a source region 4, and a drain region 5 are formed on a semiconductor substrate 1 which is, for example, a (100) silicon substrate by known fabrication steps. The gate region 2 includes a gate insulating film 2a and a polycrystalline silicon gate 2b formed over the gate insulating film 2a. A nickel film 6 is formed over the semiconductor substrate 1 (film formation step (FIG. 1A)).

A nickel alloy film which contains one or more of platinum, tungsten, tantalum, and palladium may be formed in place of the nickel film 6.

Annealing treatment is then performed in an atmosphere of an inert gas, such as $N_2$ or argon (Ar), at a temperature of about 260° C. to form dinickel silicide 7 in the gate region 2, the source region 4, and the drain region 5 (first annealing step followed by selective etching of unreacted nickel (FIG. 1B)).

Plasma (such as hydrogen plasma or ammonia plasma) which contains hydrogen ions ($H^+$) is then generated in an atmosphere of an inert gas at a temperature (room temperature, for example) at which the dinickel silicide 7 does not phase-transform into nickel silicide, and hydrogen ions are implanted in the dinickel silicide 7 and the gate region 2 (polycrystalline silicon gate 2b), the source region 4, and the drain region 5 thereunder (plasma treatment step). Annealing treatment is then performed in an atmosphere which contains an inert gas or silane ($SiH_4$) at a temperature of, for example, about 400° C. to phase-transform the dinickel silicide 7 into nickel silicide 8 (second annealing step (FIG. 1C).

The reason for performing the second annealing step in an atmosphere which contains silane is as follows.

By supplying silane at the time when the dinickel silicide phase-transforms into the nickel silicide in the second annealing step, the dinickel silicide reacts with silicon and silane reacts with the dinickel silicide. As a result, an interface between the nickel silicide 8 and the silicon can be drawn up toward the surface of the substrate. This increases the distance between a pn junction and the interface between the nickel silicide 8 and the silicon. Therefore, junction leakage can be reduced.

The plasma treatment step and the second annealing step may be performed at the same time.

The plasma treatment step may be performed after the second annealing step. In this case, the nickel disilicide 7 is phase-transformed into the nickel silicide 8. Hydrogen ions are then implanted in the nickel silicide 8 and the gate region 2, the source region 4, and the drain region 5 thereunder.

To evaluate the thermal stability of the nickel silicide 8 formed by the above method, results obtained by measuring the sheet resistance of the nickel silicide 8 will be shown below. Not the semiconductor substrate 1 on which the above MOS structure is formed but a silicon substrate over which nickel silicide is formed was used for measuring sheet resistance. However, the characteristic of the nickel silicide formed over the silicon substrate is almost the same as that of the nickel silicide 8 formed over the semiconductor substrate 1 shown in FIGS. 1A, 1B, and 1C.

For the sake of comparison the dependence of the sheet resistance of nickel silicide formed after depositing nickel and implanting hydrogen ions on temperature will be shown first.

Figure 2:
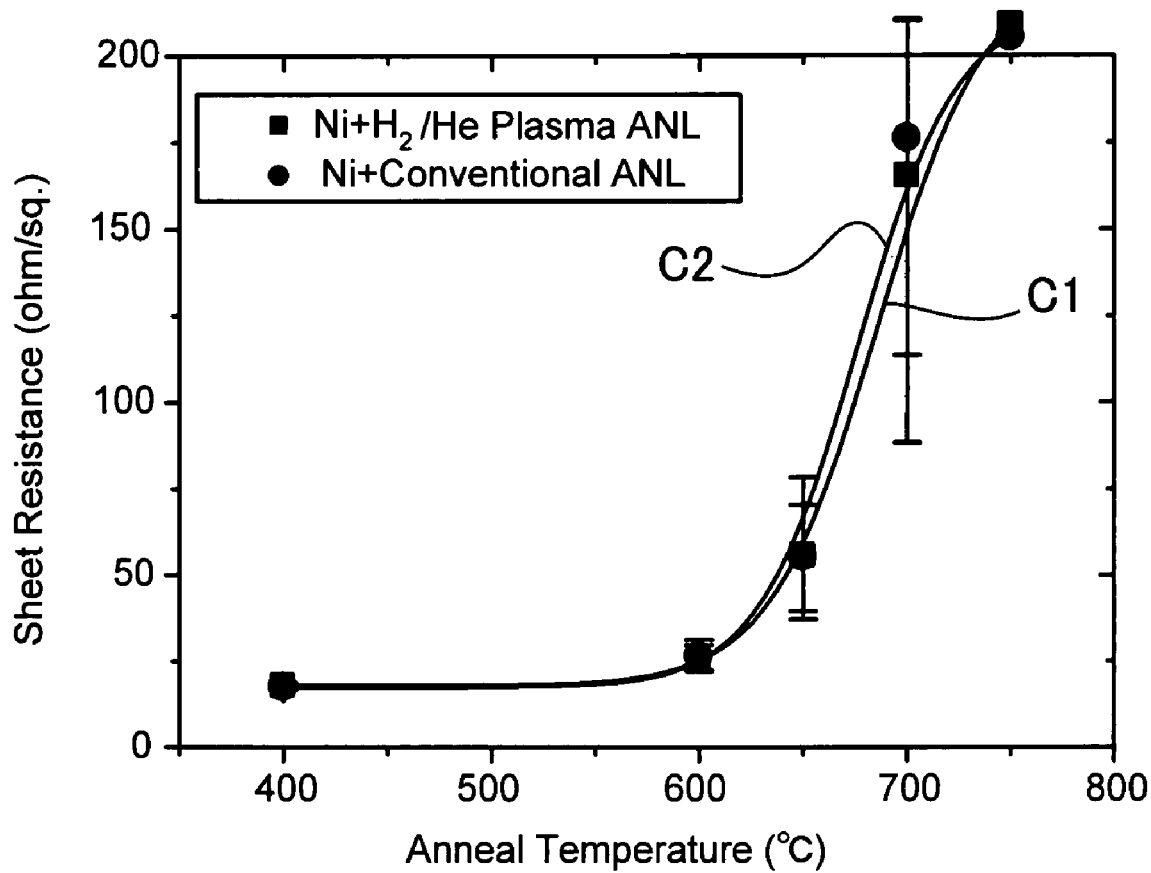
FIG. 2 is a graph showing the dependence of the sheet resistance of nickel silicide formed by depositing nickel over a silicon substrate and performing hydrogen plasma treatment and annealing on temperature.

FIG. 2 is a graph showing the dependence of the sheet resistance of nickel silicide formed by depositing nickel over a silicon substrate and performing hydrogen plasma treatment and annealing on temperature.

In FIG. 2, a vertical axis indicates sheet resistance (ohm/sq.) and a horizontal axis indicates annealing temperature (° C.). C1 shows the sheet resistance of a sample obtained by depositing a nickel film with a thickness of 10 nm over a silicon substrate and performing hydrogen plasma (mixed with helium gas) treatment and annealing treatment at a temperature of 400° C. at the same time. For the sake of comparison C2 shows the sheet resistance of a sample obtained by depositing a nickel film with a thickness of 10 nm over a silicon substrate and performing annealing treatment at a temperature of 400° C. (hydrogen plasma treatment is not performed). Additional annealing is performed on these samples at a temperature of 600° C. to 750° C. Results obtained by measuring the sheet resistance of these samples are indicated by the graphs in FIG. 2.

With a rise in annealing temperature, as shown in FIG. 2, agglomeration occurs and resistance increases. However, there is little difference in sheet resistance between the case where the hydrogen plasma treatment is performed after the nickel deposition and the case where hydrogen plasma treatment is not performed.

That is to say, in the case where a nickel silicide film is formed by depositing the nickel film with a thickness of 20 nm, implanting hydrogen ions after the nickel deposition hardly improved the thermal stability.

Figure 3:
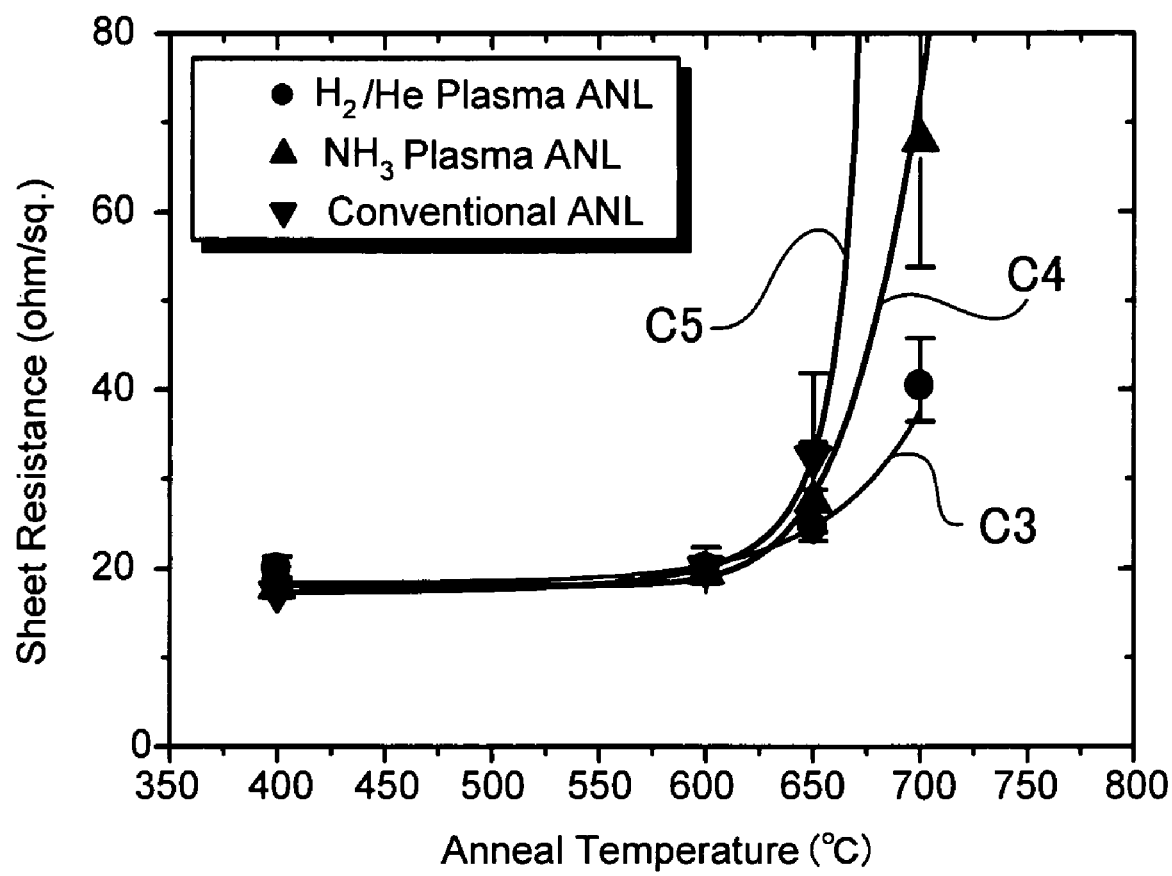
FIG. 3 are graphs showing the dependence of the sheet resistance of nickel silicide formed by depositing nickel over a silicon substrate, performing a first annealing step, and performing a plasma treatment step and a second annealing step at the same time on temperature.

FIG. 3 are graphs showing the dependence of the sheet resistance of nickel silicide formed by depositing nickel over a silicon substrate, performing a first annealing step, a selective etching step, and performing a plasma treatment step and a second annealing step at the same time on temperature.

In FIG. 3, a vertical axis indicates sheet resistance (ohm/sq.) and a horizontal axis indicates annealing temperature (° C.). C3 shows the sheet resistance of a sample (nickel silicide) formed by depositing a nickel film with a thickness of 20 nm over a silicon substrate, performing a first annealing step followed by selective etching, and performing hydrogen plasma (mixed with helium gas) treatment and a second annealing step at a temperature of 400° C. at the same time. C4 shows the sheet resistance of a sample formed by performing ammonia plasma treatment in place of hydrogen plasma treatment. For the sake of comparison C5 shows the sheet resistance of a sample formed by performing a second annealing step after a first annealing and a selective etching step without performing a plasma treatment step. Additional annealing is performed on these samples at a temperature of 600° C. to 700° C. Results obtained by measuring the sheet resistance of these samples are indicated by the graphs in FIG. 3.

With a rise in annealing temperature, as shown in FIG. 3, agglomeration occurs and resistance increases. By performing the plasma treatment with plasma which contains hydrogen ions after the first annealing step followed by selective etching, however, an increase in resistance at high temperatures is suppressed compared with the case of FIG. 2. That is to say, it turns out that the thermal stability of a nickel silicide film can be improved and that agglomeration can be suppressed.

Figure 4:
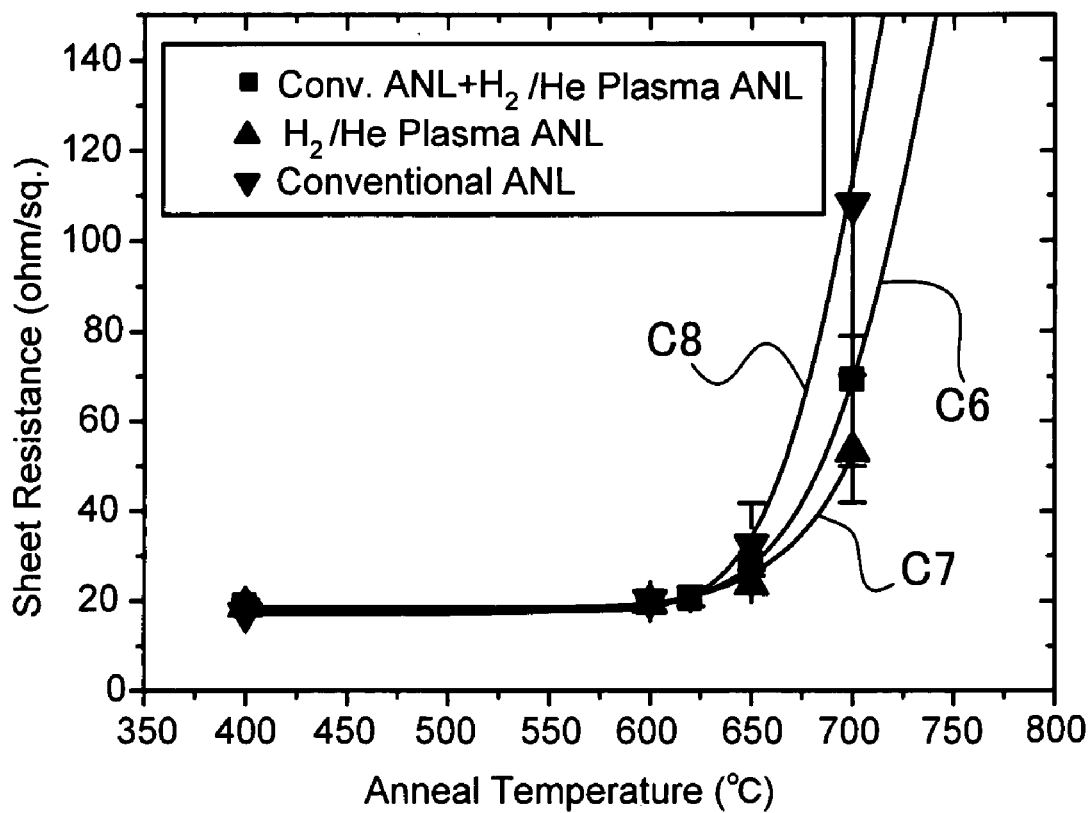
FIG. 4 is a graph showing the dependence of the sheet resistance of nickel silicide formed by performing a plasma treatment step after a second annealing step on temperature.

FIG. 4 is a graph showing the dependence of the sheet resistance of nickel silicide formed by performing a plasma treatment step after a second annealing step on temperature.

In FIG. 4, a vertical axis indicates sheet resistance (ohm/sq.) and a horizontal axis indicates annealing temperature (° C.). C6 shows the sheet resistance of nickel silicide formed by performing a second annealing step, that is to say, phase-transforming dinickel silicide into nickel silicide and performing a hydrogen plasma treatment step. C7 shows the sheet resistance of nickel silicide formed by performing a hydrogen plasma treatment step and a second annealing step at the same time. C8 shows the sheet resistance of nickel silicide formed only by performing a first annealing step, a selective etching step and a second annealing step. Additional annealing is performed on these samples at a temperature of 600° C. to 700° C. Results obtained by measuring the sheet resistance of these samples are indicated by the graphs in FIG. 4.

As can be seen in FIG. 4, an increase in resistance can be suppressed most by performing a hydrogen plasma treatment step and a second annealing step at the same time. However, it turns out that compared with the case where only annealing steps are performed for forming nickel silicide, an increase in resistance at high temperatures can be suppressed by performing a hydrogen plasma treatment step after a second annealing step. That is to say, it turns out that even after nickel silicide is formed by the second annealing step, performing the hydrogen plasma treatment step improves the thermal stability of a nickel silicide film and suppresses agglomeration.

By the way, the principal factor in the improvement of the thermal stability of nickel silicide is a reduction in grain size according to C.-J. Choi, et al., "Effects of Hydrogen Implantation on the Structural and Electrical Properties of Nickel Silicide", J. Electrochem. Soc., 149, G517 (2002). However, grain size does not change even after the phase transformation of nickel disilicide into nickel silicide. Nevertheless, as shown in FIG. 4, the thermal stability is improved by performing hydrogen plasma treatment. This means that the principal factor in the improvement of the thermal stability of nickel silicide is not a reduction in grain size.

The reason why the thermal stability of nickel silicide is improved by the method for fabricating a semiconductor device, according to the embodiment of the present invention will be system stabilization due to:

(1) reduction of a trace of oxygen contained in nickel silicide and silicon regions thereunder (the gate region 2, the source region 4, and the drain region 5 in FIGS. 1A, 1B, and 1C, for example), (2) elimination of minute defects, (3) reduction in stress, and the like caused by hydrogen ions implanted in the plasma treatment step.

In particular, an interface between the nickel silicide and the silicon regions thereunder tends to contain a large amount of oxygen by the influence of, for example, a native oxide film. Therefore, the thermal stability of nickel silicide can be improved further by controlling electric power at plasma treatment time so as to implant hydrogen ions near the interface.

As has been described, the method for fabricating a semiconductor device, according to the embodiment of the present invention can significantly improve the thermal stability of nickel silicide, compared with the case where hydrogen plasma treatment is performed immediately after the formation of a nickel film.

The method for fabricating a semiconductor device, according to the embodiment of the present invention will now be described in detail.

The following fabrication conditions are examples and other fabrication conditions may be applied.

Each of FIGS. 5A through 15B is a sectional view showing a step of the method for fabricating a semiconductor device, according to the embodiment of the present invention.

Figure 5A:
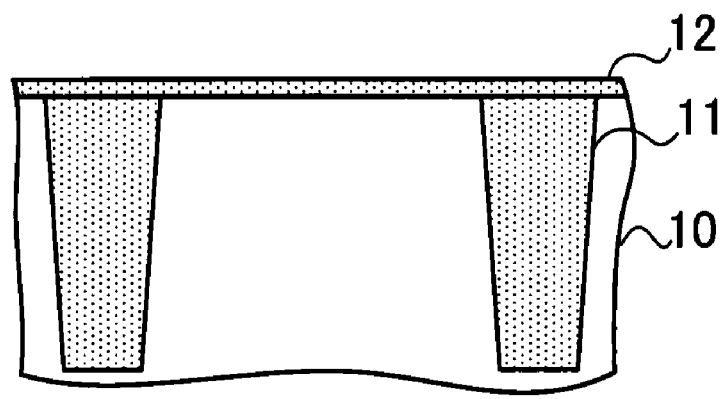
FIGS. 5A and 5B are sectional views showing a step of the method for fabricating a semiconductor device, according to the embodiment of the present invention (part 1).
Figure 5B:
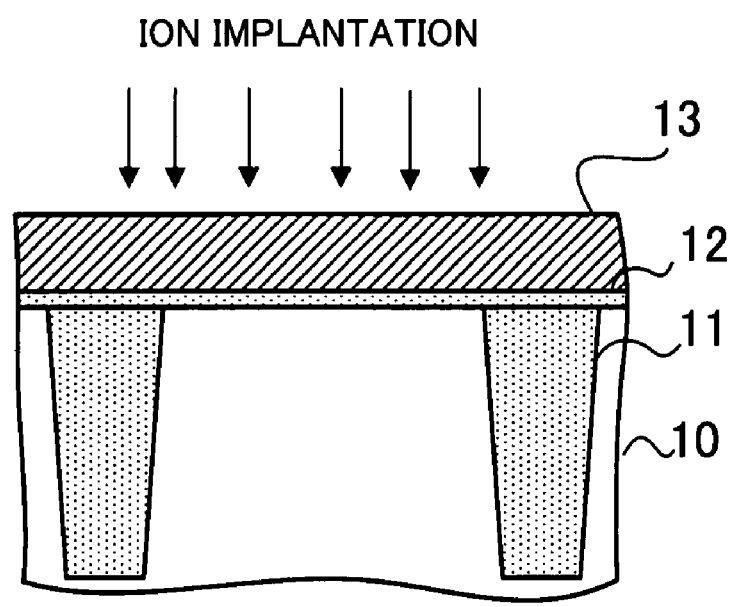

First, donors or acceptors are implanted in a p-type (100) Si substrate (hereinafter simply referred to as the silicon substrate 10), for example, to form a well (not shown). Shallow trench isolations (STI) 11 are then formed. Ion implantation for a channel is then performed to form a channel region (not shown). A gate insulating film 12 with a thickness of 2 nm is then formed by chemical vapor deposition (CVD) (FIG. 5A). After a polycrystalline silicon film 13 with a thickness of 100 nm is deposited, phosphorus ions, for example, are implanted with a dose of $1.0 \times 10^{16}$ ions/cm$^2$ at an energy of 10 keV to form an n-channel MOSFET. To form a p-channel MOSFET, boron ions (B$^+$), for example, are implanted with a dose of 5.0×10$^{15}$ ions/cm$^2$ at an energy of 5 keV (FIG. 5B).

Figure 6A:
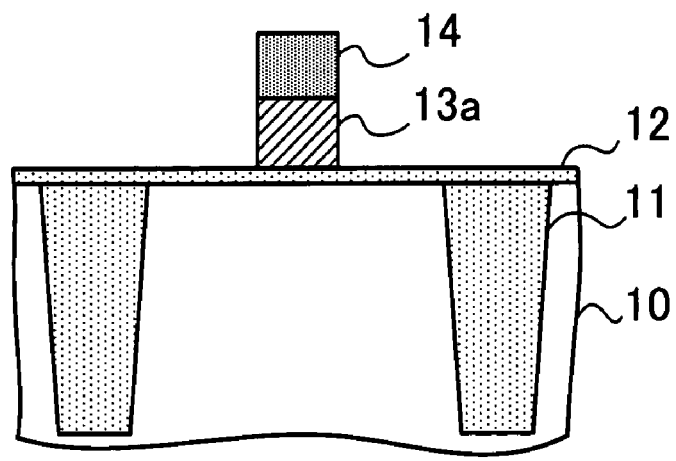
FIGS. 6A and 6B are sectional views showing a step of the method for fabricating a semiconductor device, according to the embodiment of the present invention (part 2).
Figure 6B:
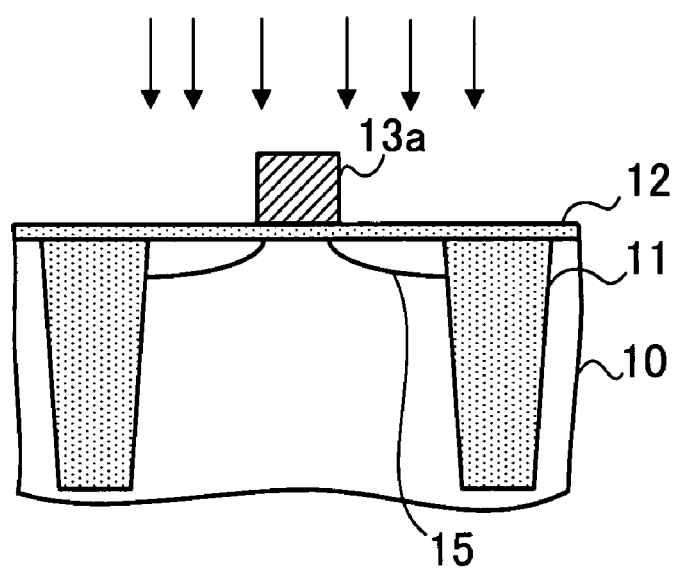

The polycrystalline silicon film 13 is then etched with a photoresist pattern 14 on which patterning has been performed as a mask to form a polycrystalline silicon gate 13a (FIG. 6A). After the photoresist pattern 14 is removed, extension implantation is performed to form extension regions 15 (FIG. 6B). When the extension regions 15 are formed, arsenic ions (As$^+$), for example, are implanted with a dose of 1.0×10$^{15}$ ions/cm$^2$ at an energy of 1 keV (in the case of an n-channel MOSFET) or boron ions, for example, are implanted with a dose of 1.0×10$^{15}$ ions/cm$^2$ at an energy of 0.5 keV (in the case of a p-channel MOSFET).

Figure 7A:
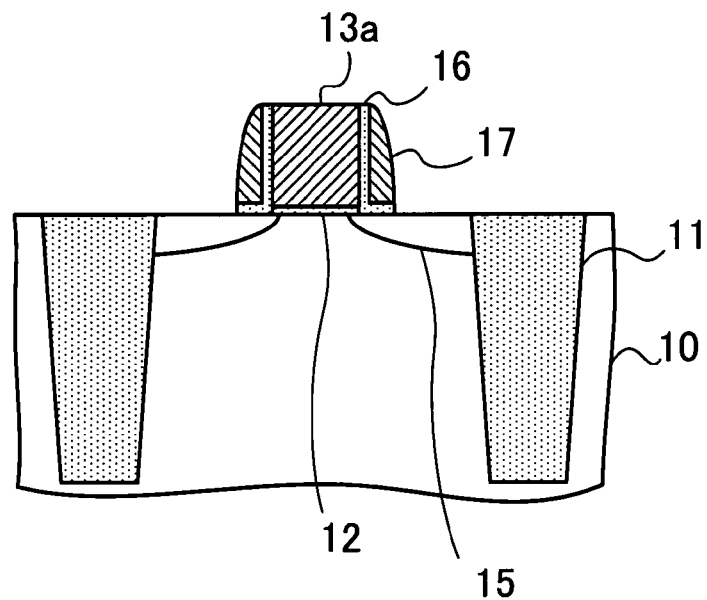
FIGS. 7A and 7B are sectional views showing a step of the method for fabricating a semiconductor device, according to the embodiment of the present invention (part 3).
Figure 7B:
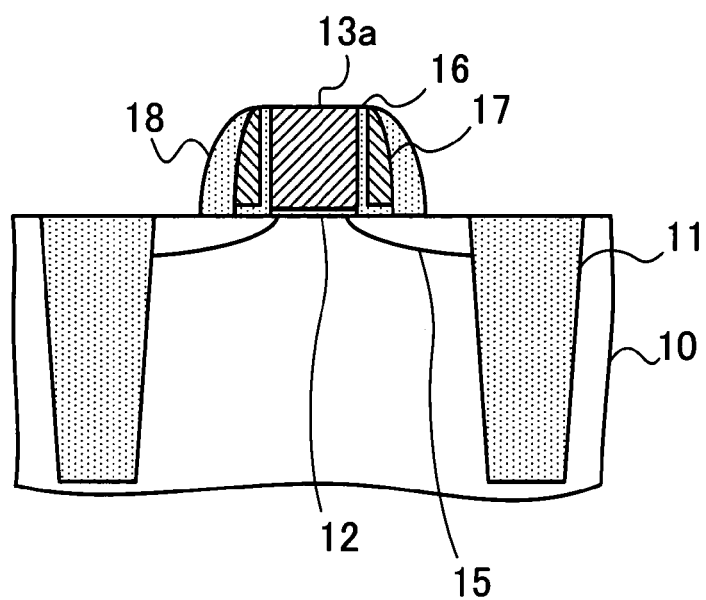

An oxide film with a thickness of 10 nm and a silicon nitride film with a thickness of 80 nm are then formed by the CVD. Sidewalls 16 and sidewall spacers 17 are formed by an etch-back (FIG. 7A). An oxide film with a thickness of 30 nm is then formed by the CVD. Sidewalls 18 are formed by an etch-back (FIG. 7B).

Descriptions of the steps will now be continued by showing both a region where an n-channel MOSFET is to be formed and a region where a p-channel MOSFET is to be formed.

Figure 8A:
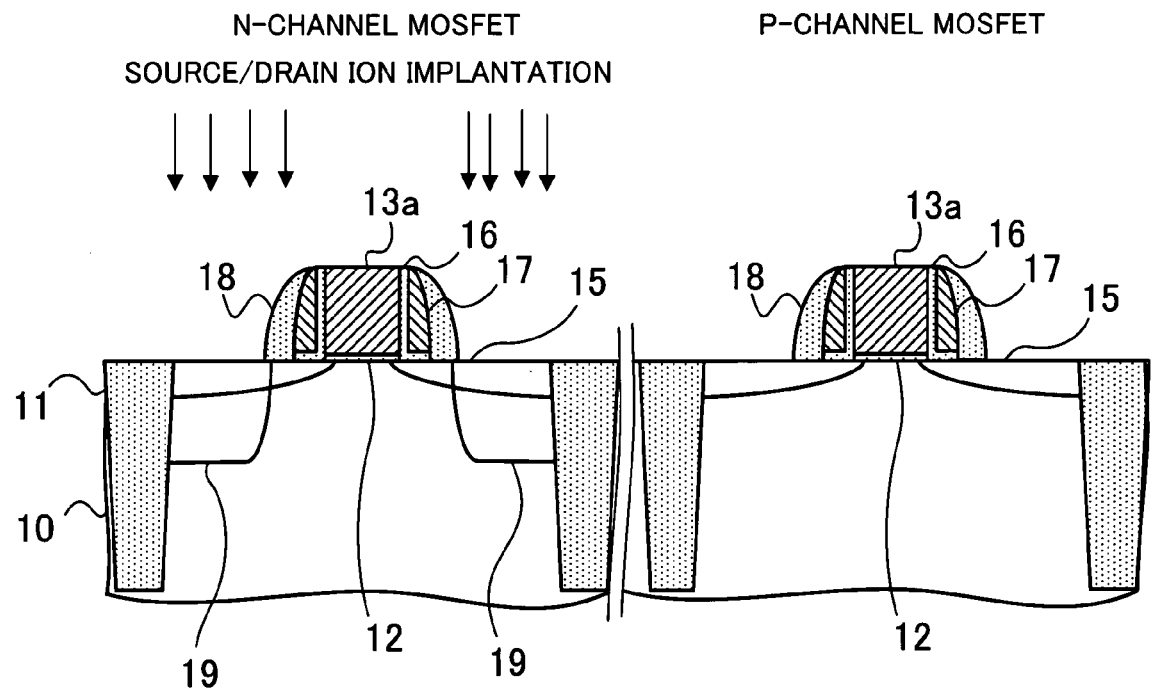
FIGS. 8A and 8B are sectional views showing a step of the method for fabricating a semiconductor device, according to the embodiment of the present invention (part 4).
Figure 8B:
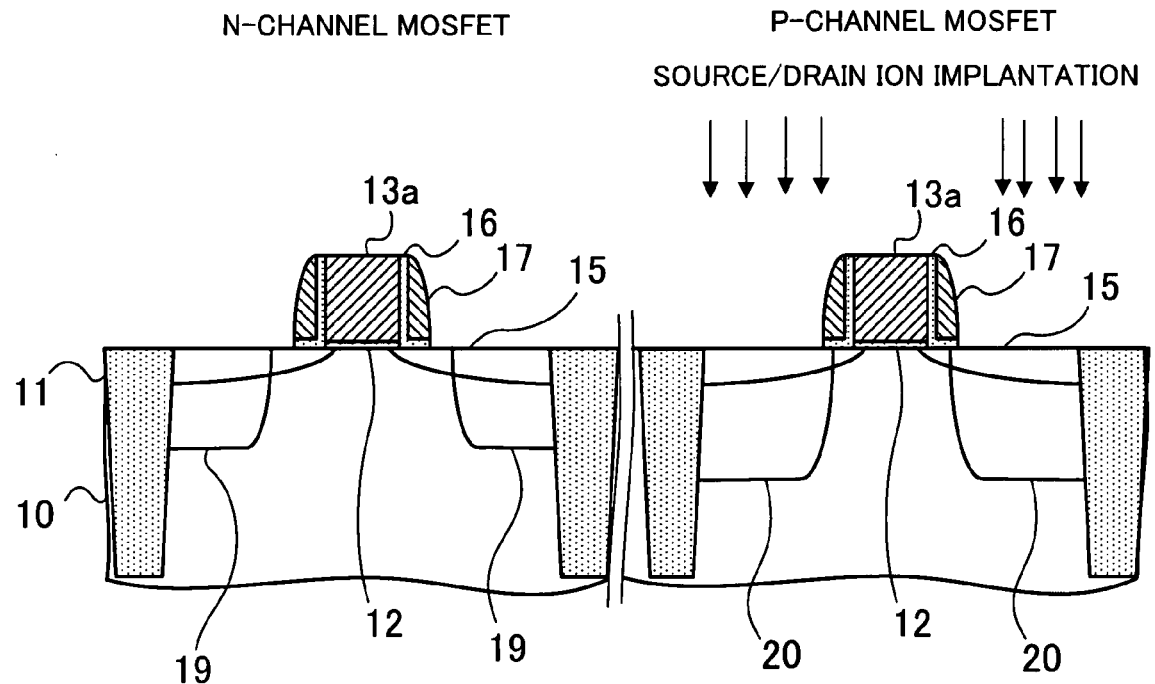

After the sidewalls 18 are formed, ion implantation is performed at low acceleration energy to lower the resistance of the extension regions 15. Ion implantation is then performed to form source/drain regions 19 in the region where the n-channel MOSFET is to be formed (ion implantation using boron ions, for example, is performed for forming the p-channel MOSFET and ion implantation using arsenic ions, for example, is performed for forming the n-channel MOSFET). Activation annealing is then performed (FIG. 8A). After the sidewalls 18 are removed, ion implantation is performed in the same way to form source/drain regions 20 in the region where the p-channel MOSFET is to be formed. Activation annealing is then performed (FIG. 8B).

Figure 9A:
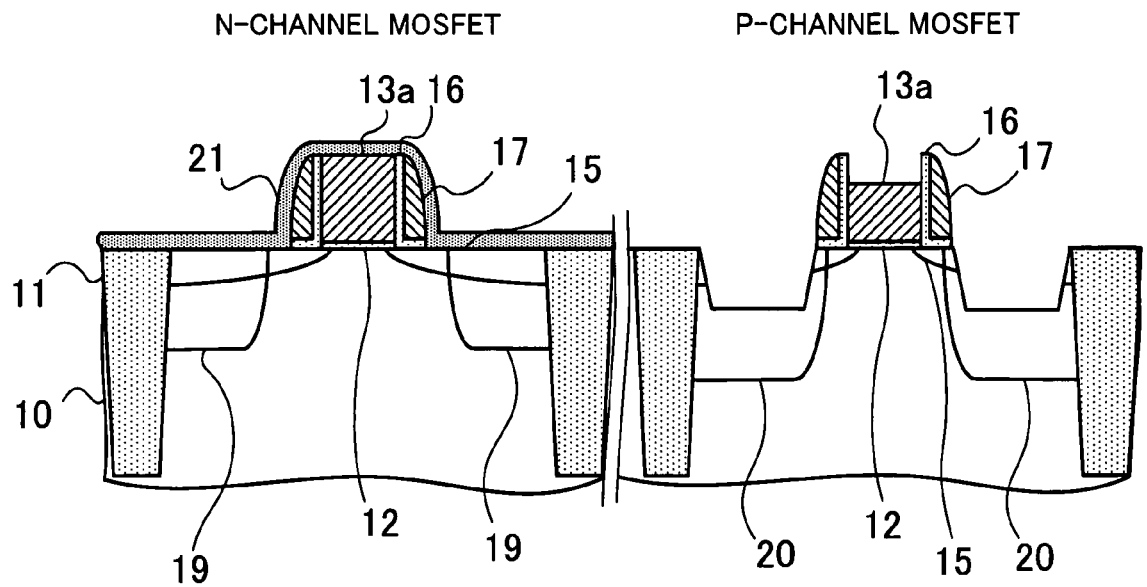
FIGS. 9A and 9B are sectional views showing a step of the method for fabricating a semiconductor device, according to the embodiment of the present invention (part 5).
Figure 9B:
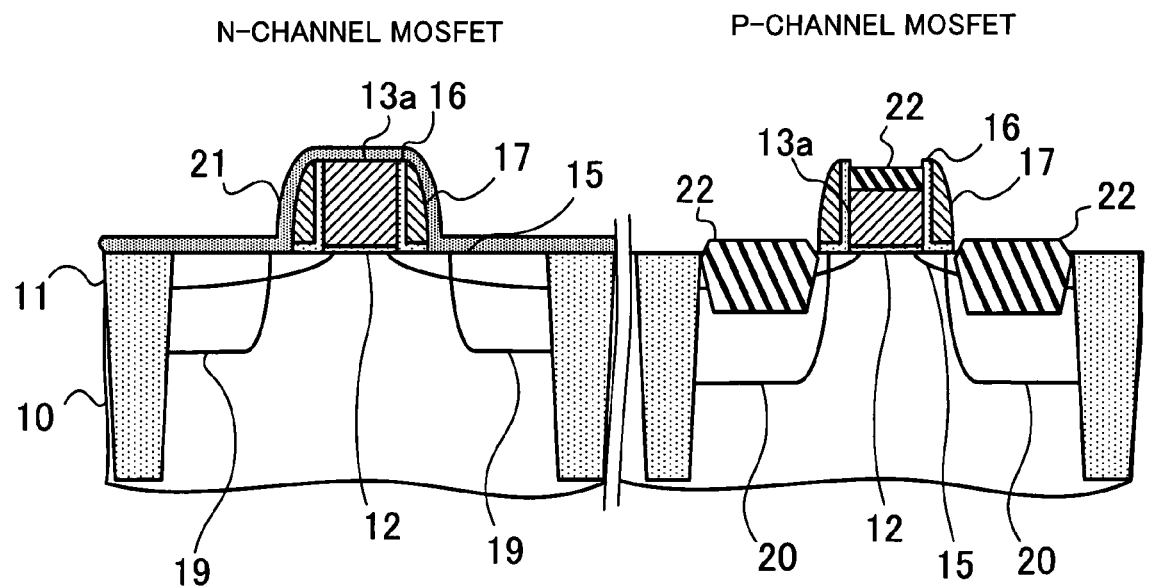

The region where the n-channel MOSFET is to be formed is covered with an oxide film 21 used as a mask and the source/drain regions 20 in the region where the p-channel MOSFET is to be formed are etched (FIG. 9A). Silicon germanium (SiGe) 22 is then made to selectively epitaxial-grow in the etched regions (FIG. 9B).

Figure 10A:
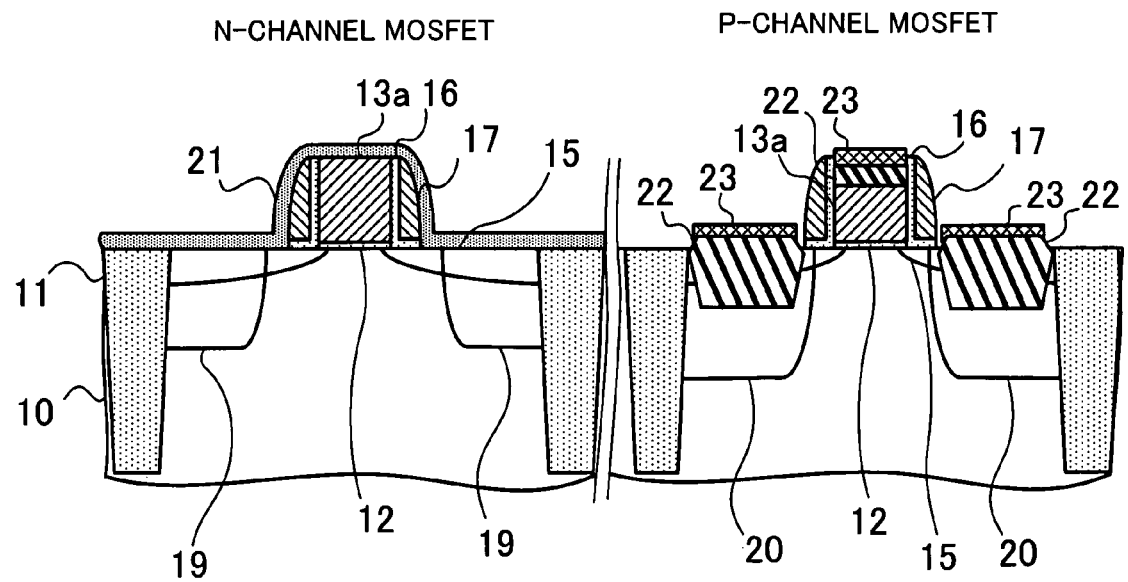
FIGS. 10A and 10B are sectional views showing a step of the method for fabricating a semiconductor device, according to the embodiment of the present invention (part 6).
Figure 10B:
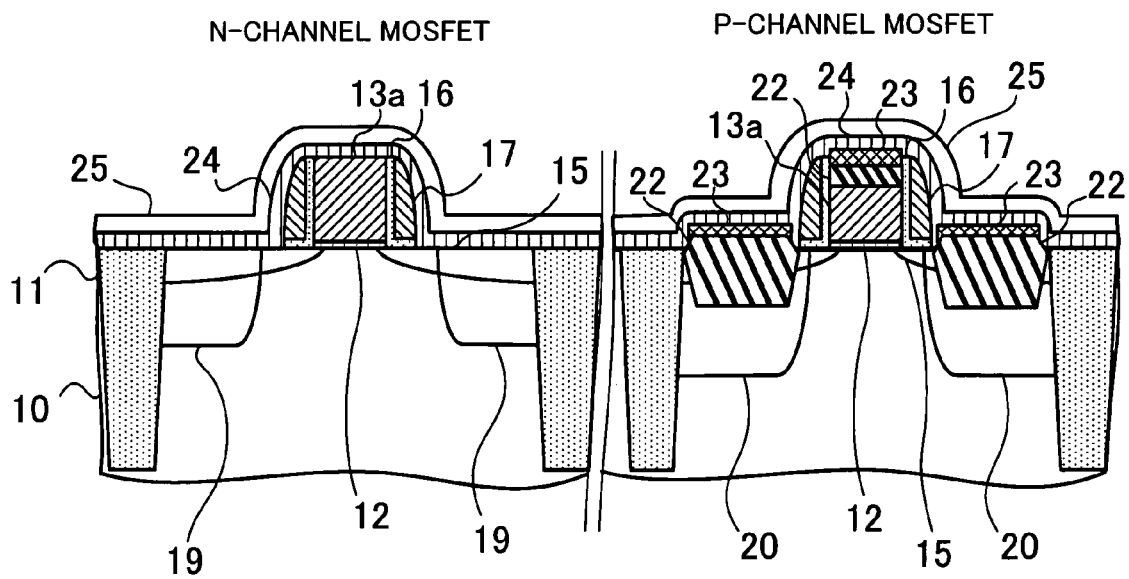

A silicon layer 23 is then made to selectively epitaxial-grow over the silicon germanium 22 (FIG. 10A). When nickel silicide is formed in a later step, germanium may mingle with the nickel silicide. As a result, the thermal stability of the nickel silicide deteriorates. This is the reason why the silicon layer 23 is made to selectively epitaxial-grow over the silicon germanium 22. The oxide film 21 over the region where the n-channel MOSFET is to be formed is then removed by hydrofluoric acid (HF) or the like. A nickel film 24 with a thickness of, for example, 20 nm is deposited by a sputtering method in which a nickel target is used. A protection film 25 of titanium nitride (TiN) is then formed over the nickel film 24 (FIG. 10B).

The thickness of the nickel film 24 may be set to 8 to 200 nm. However, if the nickel film 24 is thin, the amount of nickel supplied is small when nickel and silicon react. As a result, silicon-rich nickel disilicide is apt to be formed. The lattice constant of nickel disilicide (5.41 Å) is approximately the same as the lattice constant of silicon (5.43 Å). Accordingly, spikes are formed along the (111) Si plane and junction leakage increases.

If the nickel film 24 is thick, the amount of nickel supplied is large when nickel and silicon react. As a result, nickel-rich dinickel silicide is apt to be formed. As a result, an interface between the nickel disilicide and silicon becomes flat. However, if the nickel film 24 is too thick, then nickel cannot completely be removed in a later step for removing nickel which does not react with silicon.

If these reasons are taken into consideration, it is desirable that the thickness of the nickel film 24 should be set to 15 to 30 nm.

A nickel alloy target may be used in place of a nickel target. For example, a nickel alloy target which contains one or more of platinum, tungsten, tantalum, and palladium which prevent nickel silicide from agglomerating is used. If a target made of an alloy of nickel and platinum, for example, is used, then the platinum content should be 1 to 10 atom percent.

The protection film 25 may be formed by using titanium (Ti) in place of titanium nitride (TiN). There is no need to form the protection film 25.

The first annealing step, the selective etching step, and the second annealing step are then performed to form nickel silicide.

Figure 11A:
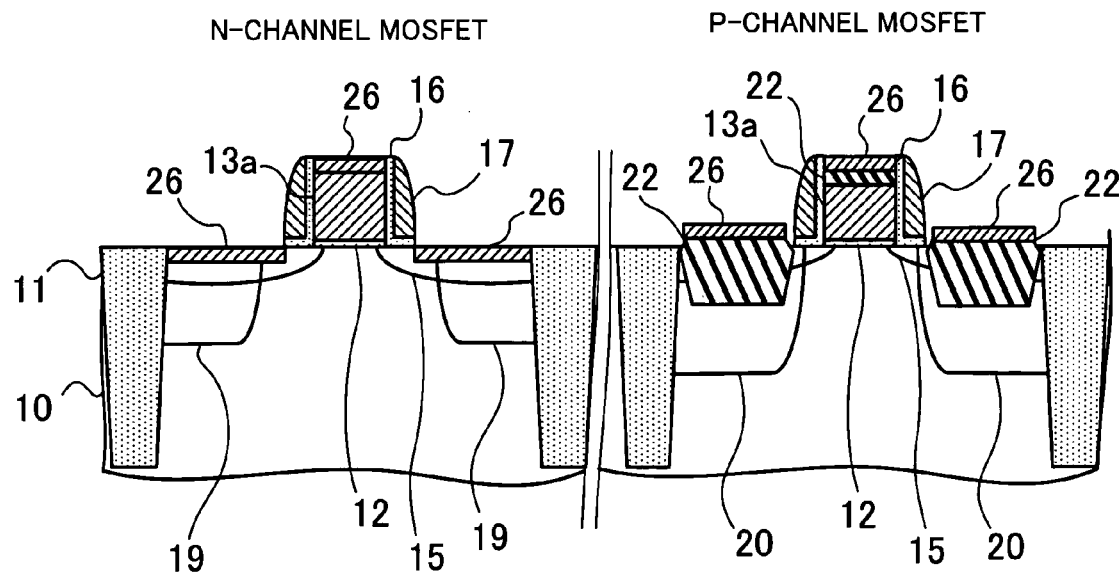
FIGS. 11A and 11B are sectional views showing a step of the method for fabricating a semiconductor device, according to the embodiment of the present invention (part 7).

In the first annealing step, annealing is performed in an atmosphere of an inert gas at a temperature of, for example, 260° C. for 30 seconds to form dinickel silicide 26 first. The protection film 25 and the nickel film 24 which does not react with silicon are then removed by using a solution in which the ratio of sulfuric acid (H$_2$SO$_4$) to hydrogen peroxide is three to one (FIG. 11A).

The first annealing step may be performed at a temperature of 200° C. to 350° C. for 10 seconds to 400 seconds so that the dinickel silicide 26 can be formed. However, to improve throughput, the shortest possible annealing time should be set.

A solution which contains hydrochloric acid (HCl) and hydrogen peroxide may be used in place of a solution which contains sulfuric acid and hydrogen peroxide.

The plasma treatment step and the second annealing step are then performed.

In this example, plasma treatment and annealing treatment are performed at the same time.

Figure 11B:
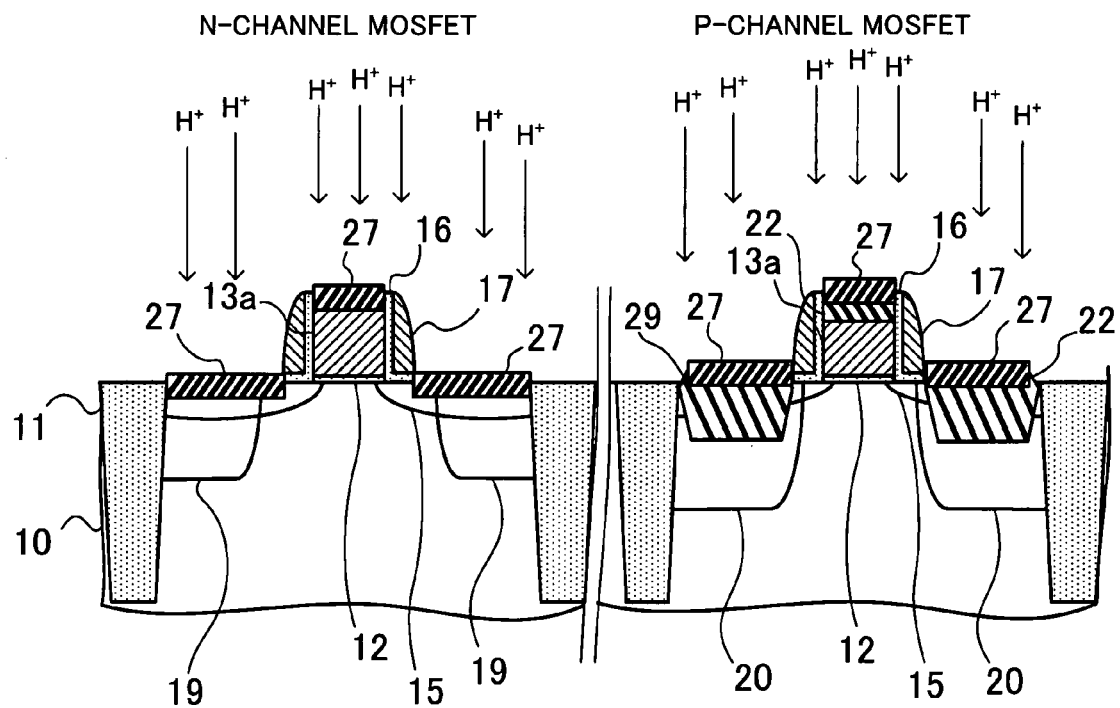

To implant hydrogen ions near an interface between the dinickel silicide 26 and the gate region, the source region, and the drain region thereunder, it is desirable that the plasma treatment should be performed by applying 100 to 750 W of electric power per 200-millimeter wafer. The plasma treatment is performed in an atmosphere of an inert gas at a vacuum level of about 1 mTorr to 10 Torr. The annealing treatment is performed at a temperature of 400° C. at the same time as the plasma treatment to phase-transform the dinickel silicide 26 into nickel (mono)silicide 27 (FIG. 11B).

In the following interconnection step, for example, the wafer is exposed to a high temperature and phase transformation proceeds. If this is taken into consideration, the annealing treatment may be performed at a temperature of 300° C. to 500° C. for 10 seconds to 400 seconds. The annealing time should be determined with the annealing temperature taken into consideration. However, if the annealing temperature is to high, agglomeration of the nickel silicide 27 the grain size of which is small proceeds. Accordingly, it is more desirable that the annealing treatment should be performed at a temperature of 320° C. to 450° C. The annealing time should be set to 10 seconds to 120 seconds with the annealing temperature and throughput taken into consideration.

Not only hydrogen plasma but also ammonia plasma may be generated. Diborane (B$_2$H$_6$) plasma, silane plasma, or disilane (Si$_2$H$_6$) plasma which contains hydrogen ions may be used.

If such plasma is used for implanting hydrogen ions near the interface between the dinickel silicide 26 and the gate region, the source region, and the drain region thereunder, high electric power must be applied compared with the case where hydrogen plasma is used. However, even if hydrogen ions do not reach the vicinity of the interface, the thermal stability can be improved to some degree by, for example, the reduction of a trace of oxygen contained in the dinickel silicide 26.

In addition, there is no need to perform the plasma treatment step and the second annealing step at the same time. The plasma treatment step may be performed before the second annealing step. Furthermore, the plasma treatment step may be performed after the second annealing step to implant hydrogen ions in the nickel silicide 27 and the gate region, the source region, and the drain region thereunder. In this case, electric power should be controlled according to the type of plasma to implant hydrogen ions near the interface between the nickel silicide 27 and the gate region, the source region, and the drain region thereunder. By doing so, the effect of improving the thermal stability can be heightened.

A known interconnection step is then performed. Only an n-channel MOSFET portion will be shown, but the same interconnection step can be applied to a p-channel MOSFET portion.

After the nickel silicide 27 is formed, treatment is performed at a temperature lower than or equal to 500° C. to prevent agglomeration from occurring.

Figure 12A:
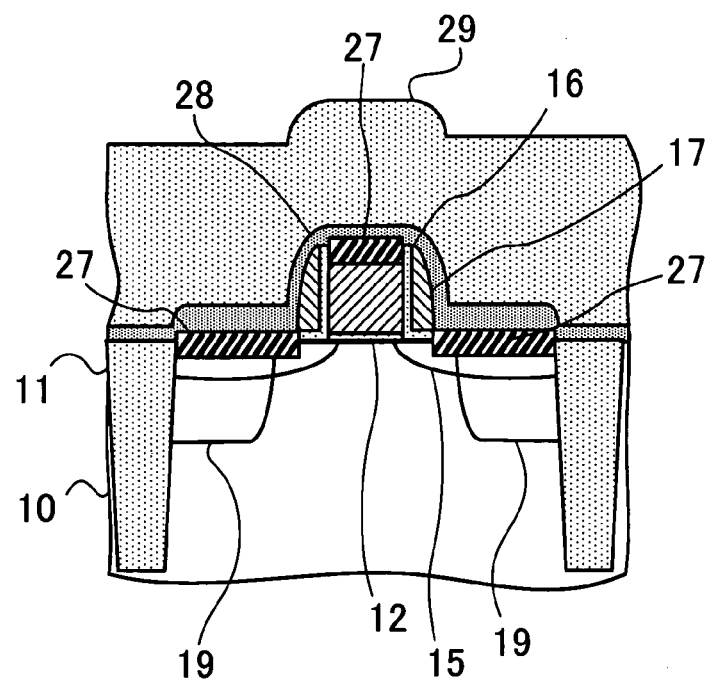
FIGS. 12A and 12B are sectional views showing a step of the method for fabricating a semiconductor device, according to the embodiment of the present invention (part 8).
Figure 12B:
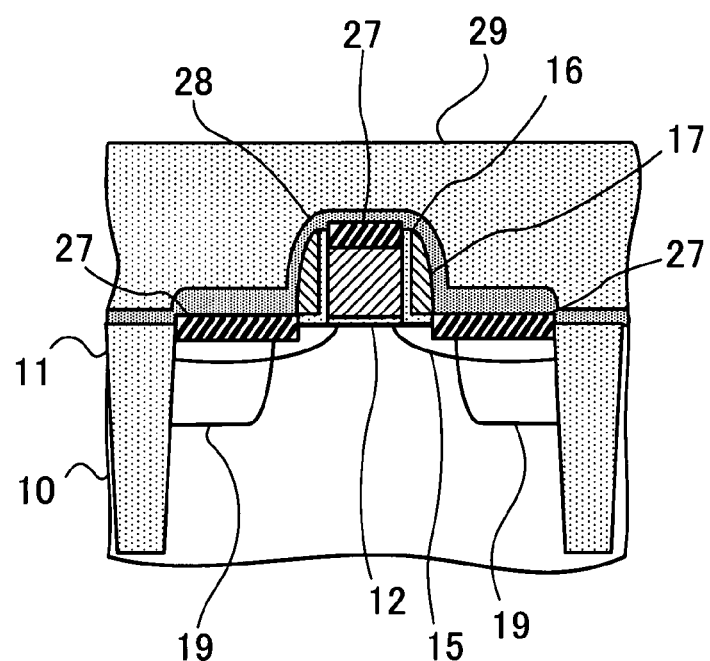

After the nickel silicide 27 is formed, a silicon nitride film 28 with a thickness of 50 nm is deposited first over the n-channel MOSFET portion at a temperature of 500° C. by plasma CVD. An oxide film 29 with a thickness of 600 nm is then deposited over the silicon nitride film 28 at a temperature of 400° C. by the plasma CVD (FIG. 12A). The oxide film 29 is then planarized by CMP (FIG. 12B).

Figure 13A:
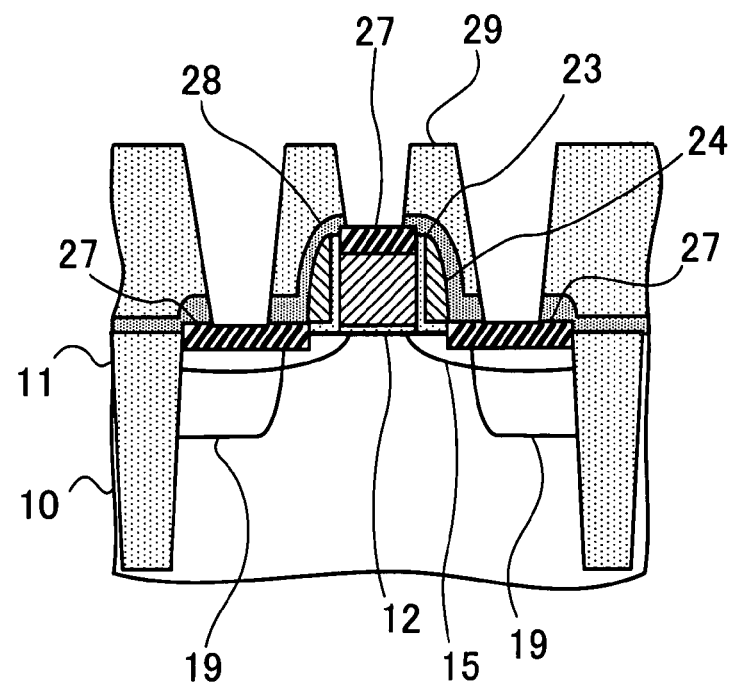
FIGS. 13A and 13B are sectional views showing a step of the method for fabricating a semiconductor device, according to the embodiment of the present invention (part 9).
Figure 13B:
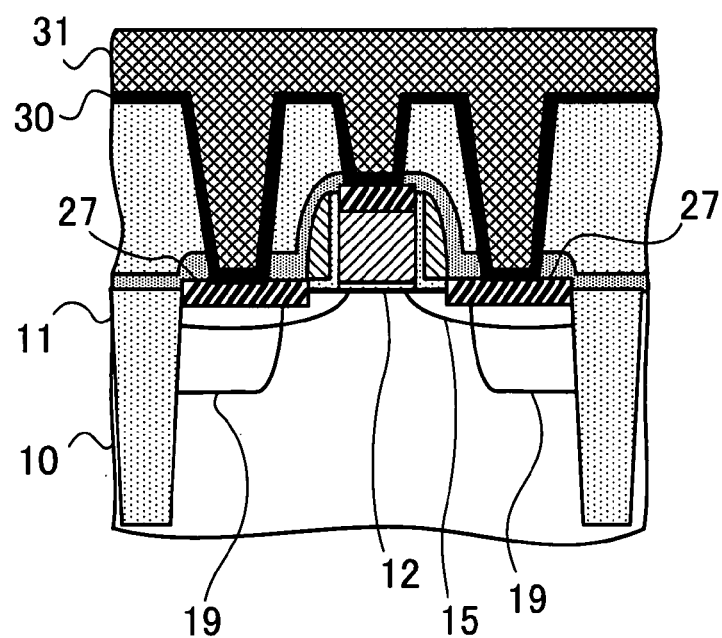

A photoresist film (not shown) is formed over the oxide film 29 and patterning is performed. After that, openings used for connecting the nickel silicide 27 which functions as electrodes of the n-channel MOSFET and an upper interconnection layer are formed by etching (FIG. 13A). A titanium nitride film 30 with a thickness of 50 nm is then deposited over the etched oxide film 29 by the sputtering method. Tungsten 31 is embedded in the openings by the CVD (FIG. 13B).

Figure 14A:
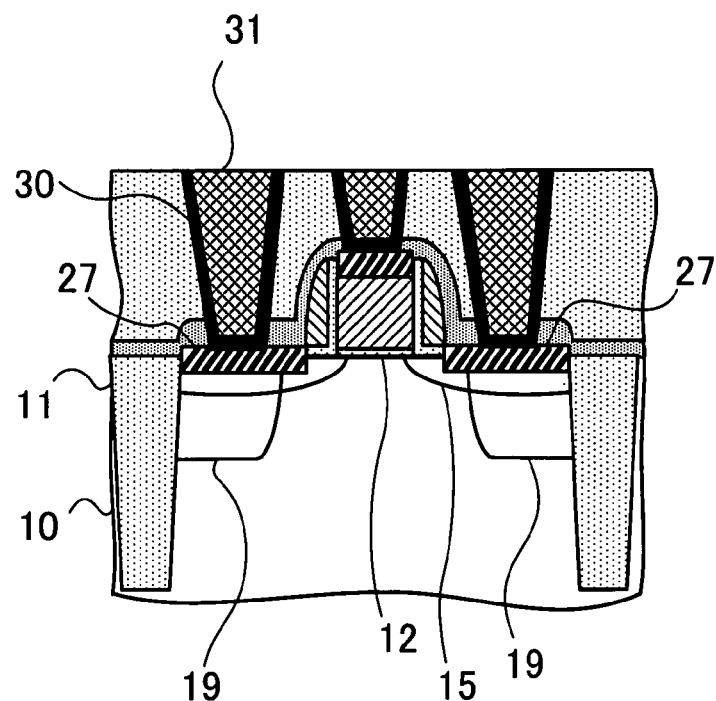
FIGS. 14A and 14B are sectional views showing a step of the method for fabricating a semiconductor device, according to the embodiment of the present invention (part 10).
Figure 14B:
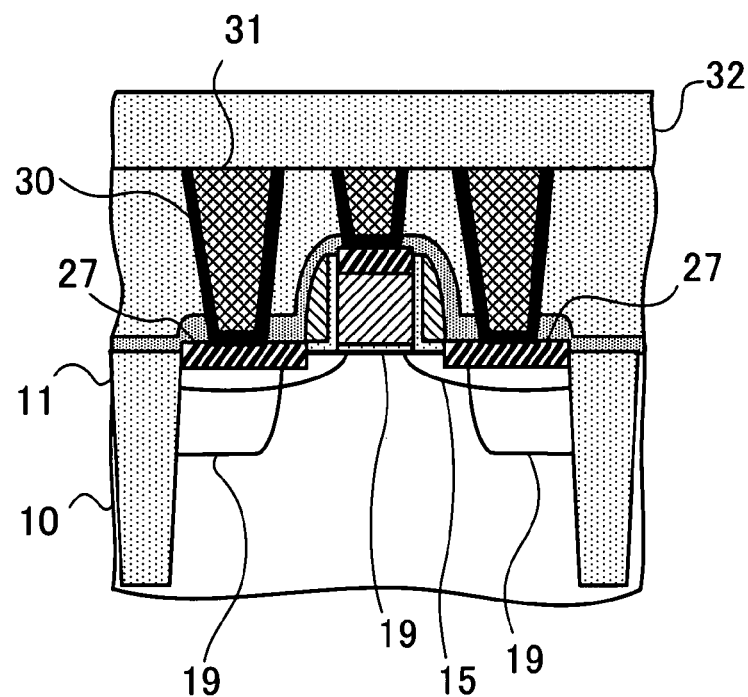

Planarization is then performed by the CMP (FIG. 14A) and an interlayer film 32 is deposited (FIG. 14B).

Figure 15:
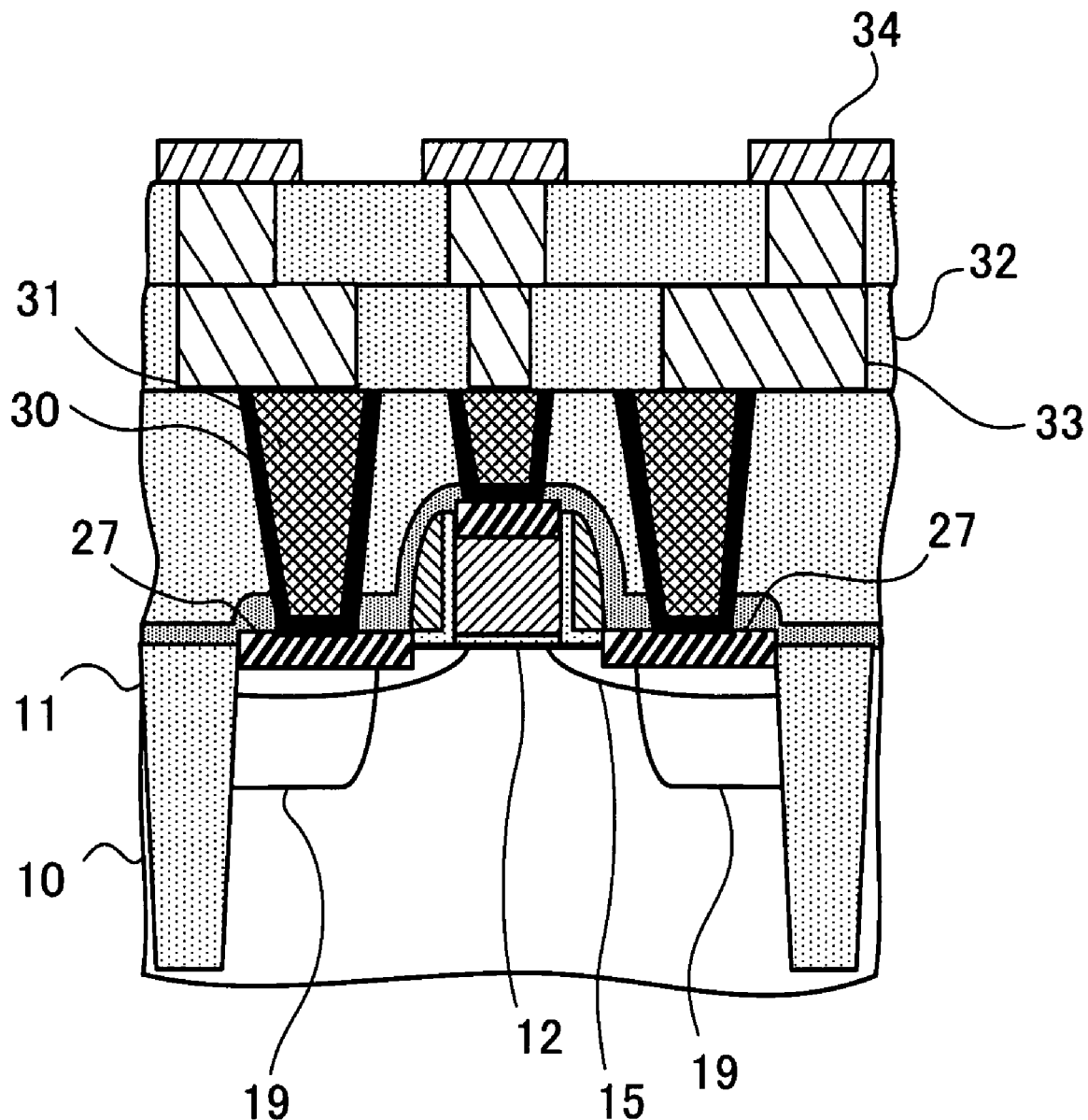
FIG. 15 is a sectional view showing a step of the method for fabricating a semiconductor device, according to the embodiment of the present invention (part 11).

Patterning is then performed on the interlayer film 32 and tantalum (not shown) is deposited as a barrier film. Copper (Cu) 33 is then embedded as interconnections. Planarization is performed by the CMP. Depositing the interlayer film 32, embedding tantalum and the copper 33, and planarization by the CMP are repeated more than one time to form a multilayer interconnection. Aluminum electrodes 34 are formed over a top layer of the copper 33. By doing so, the semiconductor device is completed (FIG. 15).

As has been described in the foregoing, with the method for fabricating a semiconductor device according to the embodiment of the present invention, hydrogen ions are implanted by the plasma treatment when nickel silicide is formed after the first annealing step. By doing so, the reduction of a trace of oxygen and the like described above occur. As a result, the thermal stability of the nickel silicide is improved and the occurrence of agglomeration can be suppressed. Accordingly, junction leakage current can be decreased.

In addition, by implanting hydrogen ions by the plasma treatment, a reduction in the roughness of the surface of the nickel silicide and the interface between the nickel silicide and the gate region, the source region, and the drain region thereunder or suppression of variation in gate resistance, source resistance, and drain resistance can be expected.

The above semiconductor device has a structure in which the mobility of holes in a channel is enhanced due to compressive stress by forming silicon-germanium compound crystals in the gate region, the source region, and the drain region of the p-channel MOSFET. However, another structure may be adopted. For example, as with the n-channel MOSFET, silicon may be used with stress on the channel taken into consideration.

Furthermore, silicon-carbon (SiC) compound crystals or silicon-germanium-carbon (SiGeC) compound crystals may be formed in the gate region, the source region, or the drain region of the n-channel MOSFET. If compound crystals which contain germanium are formed, it is desirable that nickel silicide should be formed after the formation of a silicon layer over the compound crystals formed. This prevents the thermal stability of the nickel silicide from deteriorating.

With the present invention hydrogen ions are implanted by the plasma treatment after the dinickel silicide is formed. By the influence of the hydrogen ions, the thermal stability of the nickel silicide is improved and agglomeration can be suppressed. As a result, junction leakage current can be decreased.

In addition, with the present invention hydrogen ions are implanted by the plasma treatment after the nickel silicide is formed. By the influence of the hydrogen ions, the thermal stability of the nickel silicide is improved and agglomeration can be suppressed. As a result, junction leakage current can be decreased.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method for fabricating a semiconductor device, the method comprising:
   the step of forming one of nickel and a nickel alloy over a semiconductor substrate on which a gate region, a source region, and a drain region are formed;
   the first annealing step of forming dinickel silicide in the gate region, the source region, and the drain region by performing annealing treatment at a first temperature followed by a selective etching step to remove unreacted metal;
   the plasma treatment step of generating plasma which contains hydrogen ions and implanting the hydrogen ions in one of the dinickel silicide, and the gate region, the source region, and the drain region under the dinickel silicide; and
   the second annealing step of phase-transforming the dinickel silicide into nickel silicide by performing annealing treatment at a second temperature.

2. The method according to claim 1, wherein the plasma treatment step is performed simultaneously with the second annealing step.

3. The method according to claim 1, wherein the plasma comprises hydrogen plasma.

4. The method according to claim 1, wherein the plasma comprises ammonia plasma.

5. The method according to claim 1, wherein the plasma comprises one of diborane plasma, silane plasma, and disilane plasma.

6. The method according to claim 1, wherein the hydrogen ions are implanted near an interface between the dinickel silicide and the gate region, the source region, and the drain region of the semiconductor substrate.

7. The method according to claim 3, wherein the plasma treatment step is performed under the condition of 100 W to 750 W per 200-millimeter wafer.

8. The method according to claim 1, wherein the nickel alloy contains at least one of platinum, tungsten, tantalum, and palladium.

9. The method according to claim 1, wherein one of silicon-germanium compound crystals, silicon-carbon compound crystals, and silicon-germanium-carbon compound crystals is formed in one of the gate region, the source region, and the drain region of the semiconductor substrate.

10. The method according to claim 8, wherein after a silicon layer is formed over one of the silicon-germanium compound crystals and the silicon-germanium-carbon compound crystals, one of the nickel and the nickel alloy is formed over the silicon layer.

11. The method according to claim 1, wherein the second annealing step is performed in an atmosphere which contains silane.

12. The method according to claim 1, wherein when the first annealing step is performed, the first temperature is set to 200° C. to 350° C. and annealing time is set to 10 seconds to 400 seconds.

13. The method according to claim 1, wherein when the second annealing step is performed, the second temperature is set to 300° C. to 500° C. and annealing time is set to 10 seconds to 400 seconds.

* * * * *